(12) United States Patent
Tsukamoto

(10) Patent No.: US 10,964,370 B2
(45) Date of Patent: Mar. 30, 2021

(54) SEMICONDUCTOR STORAGE ELEMENT, SEMICONDUCTOR STORAGE DEVICE, AND SEMICONDUCTOR SYSTEM

(71) Applicant: SONY SEMICONDUCTOR SOLUTIONS CORPORATION, Kanagawa (JP)

(72) Inventor: Masanori Tsukamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/336,175

(22) PCT Filed: Sep. 7, 2017

(86) PCT No.: PCT/JP2017/032317
§ 371 (c)(1),
(2) Date: Mar. 25, 2019

(87) PCT Pub. No.: WO2018/074093
PCT Pub. Date: Apr. 26, 2018

(65) Prior Publication Data
US 2019/0244653 A1    Aug. 8, 2019

(30) Foreign Application Priority Data

Oct. 20, 2016  (JP) .............................. JP2016-206246

(51) Int. Cl.
*G11C 11/22* (2006.01)
*H01L 27/11502* (2017.01)
(Continued)

(52) U.S. Cl.
CPC ............ *G11C 11/221* (2013.01); *G11C 11/22* (2013.01); *G11C 11/223* (2013.01);
(Continued)

(58) Field of Classification Search
CPC ........ G11C 11/22; G11C 11/221; H01L 27/10
(Continued)

(56) References Cited

U.S. PATENT DOCUMENTS 5,940,705 A    8/1999  Lee et al.
2001/0038117 A1*  11/2001  Haneder ................. G11C 11/22
                                                                257/315
(Continued)

FOREIGN PATENT DOCUMENTS

CN    1325549 A    12/2001
DE    19840824 C1  10/1999
(Continued)

OTHER PUBLICATIONS

International Search Report and Written Opinion of PCT Application No. PCT/JP2017/032317, dated Oct. 17, 2017, 14 pages of ISRWO.

*Primary Examiner* — Anthan Tran
(74) *Attorney, Agent, or Firm* — Chip Law Group

(57) ABSTRACT

A Provided is a semiconductor storage element that includes a memory cell transistor including a gate insulator film at least partially including ferroelectric material, and a selection transistor provided in such a manner that one of a source or a drain is connected with a gate electrode of the memory cell transistor via a connection layer, and a gate insulator film faces the gate insulator film of the memory cell transistor in a layer stack direction across the connection layer.

13 Claims, 10 Drawing Sheets

(51) Int. Cl.
  *H01L 27/1159* (2017.01)
  *H01L 27/11587* (2017.01)
  *H01L 27/10* (2006.01)
  *H01L 27/105* (2006.01)

(52) U.S. Cl.
  CPC ...... *G11C 11/2273* (2013.01); *G11C 11/2275* (2013.01); *H01L 27/10* (2013.01); *H01L 27/105* (2013.01); *H01L 27/1159* (2013.01); *H01L 27/11502* (2013.01); *H01L 27/11587* (2013.01); *G11C 11/2259* (2013.01)

(58) Field of Classification Search
  USPC .......................................................... 365/145
  See application file for complete search history.

(56) References Cited

U.S. PATENT DOCUMENTS

| | | | | |
|---|---|---|---|---|
| 2001/0055822 | A1* | 12/2001 | Kato | ........................ G11C 11/22 438/3 |
| 2007/0189056 | A1* | 8/2007 | Joo | .......................... G11C 11/22 365/145 |
| 2011/0286290 | A1 | 11/2011 | Kamata | |

FOREIGN PATENT DOCUMENTS

| | | |
|---|---|---|
| JP | 10-209389 A | 8/1998 |
| JP | 2001-229685 A | 8/2001 |
| JP | 2002-524880 A | 8/2002 |
| JP | 2006-253381 A | 9/2006 |
| JP | 2009-230834 A | 10/2009 |
| JP | 2012-003832 A | 1/2012 |
| JP | 2015-079965 A | 4/2015 |
| JP | 2016-181701 A | 10/2016 |
| KR | 10-0219519 B1 | 9/1999 |
| WO | 00/14808 A1 | 3/2000 |

* cited by examiner

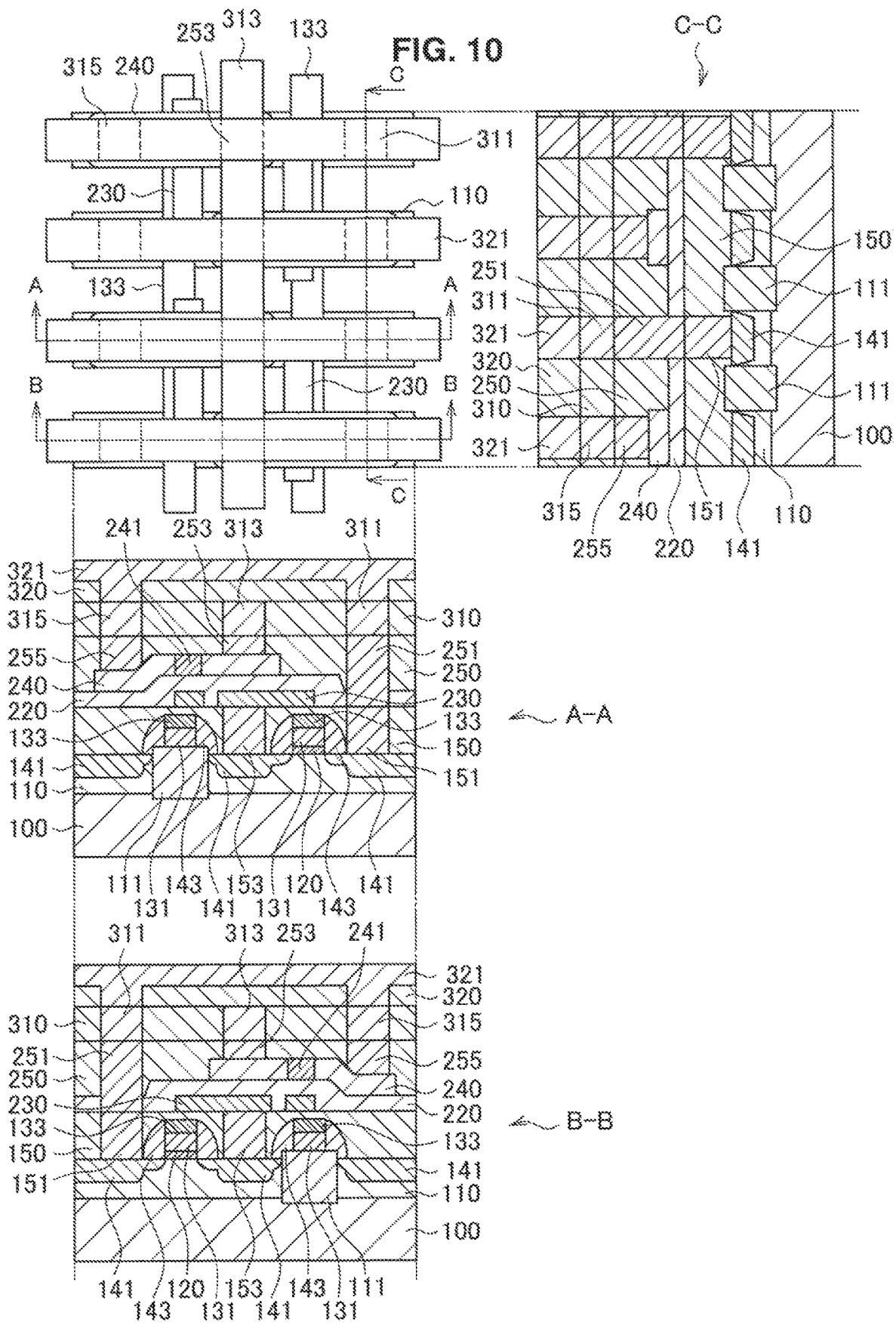

SEMICONDUCTOR STORAGE ELEMENT, SEMICONDUCTOR STORAGE DEVICE, AND SEMICONDUCTOR SYSTEM

CROSS REFERENCE TO RELATED APPLICATIONS

This application is a U.S. National Phase of International Patent Application No. PCT/JP2017/032317 filed on Sep. 7, 2017, which claims priority benefit of Japanese Patent Application No. JP 2016-206246 filed in the Japan Patent Office on Oct. 20, 2016. Each of the above-referenced applications is hereby incorporated herein by reference in its entirety.

TECHNICAL FIELD

The present disclosure relates to a semiconductor storage element, a semiconductor storage device, and a semiconductor system.

BACKGROUND ART

In recent years, a Large Scale Integration (LSI) on which an analog circuit, a memory, a logic circuit, and the like are mixedly mounted on one chip is commercialized as a System on a Chip (SoC).

As the memory mounted on the LSI, for example, a Static Random Access Memory (RAM) or the like is used. On the other hand, in recent years, it is considered to use a semiconductor storage element, such as a Dynamic RAM (DRAM), a Magnetic RAM (MRAM), or a Ferroelectric RAM (FeRAM), for reducing cost and power consumption more.

Here, the FeRAM is a semiconductor storage element that stores information using a direction of residual polarization of the ferroelectric. As a structure of the FeRAM, for example, a one-Transistor-one-Capacitor (1T1C)-type structure that uses a capacitor including a ferroelectric material, as a memory cell, a one-Transistor (1T)-type structure that uses, as a memory cell, a field effect transistor that uses a ferroelectric material in a gate insulator film, and the like are proposed.

Nevertheless, in the FeRAM of the 1T-type structure, a plurality of memory cells shares word lines and bit lines. Thus, in a case where voltage is applied to a memory cell when information is written, the voltage is applied not only to a selected memory cell but also to an unselected memory cell that shares the word lines and the bit lines. Accordingly, in the FeRAM of the 1T-type structure, there has been a possibility that, when information is written into a memory cell, information stored in the unselected memory cell is rewritten.

For example, Patent Literature 1 described below discloses a ferroelectric memory in which voltage is prevented from being applied to an unselected memory cell other than a memory cell into which information is to be written, by connecting a selection transistor to a gate of a ferroelectric transistor serving as a memory cell. In such a ferroelectric memory, information stored in the unselected memory cell can be prevented from being rewritten when information is written into the memory cell.

CITATION LIST

Patent Literature

Patent Literature 1: JP 2009-230834A

DISCLOSURE OF INVENTION

Technical Problem

Nevertheless, in the ferroelectric memory disclosed in Patent Literature 1, because a selection transistor and a wire for connecting the selection transistor and a memory cell are provided for each memory cell, a planar area of each memory cell increases. Accordingly, in the ferroelectric memory disclosed in Patent Literature 1, because it is difficult to reduce a planar area of each memory cell, it has been difficult to achieve further higher integration of memory cells.

In view of the foregoing, the present disclosure proposes a semiconductor storage element, a semiconductor storage device, and a semiconductor system that are novel and improved, and can further reduce a planar area.

Solution to Problem

According to the present disclosure, there is provided a semiconductor storage element including: a memory cell transistor including a gate insulator film at least partially including ferroelectric material; and a selection transistor provided in such a manner that one of a source or a drain is connected with a gate electrode of the memory cell transistor via a connection layer, and a gate insulator film faces the gate insulator film of the memory cell transistor in a layer stack direction across the connection layer.

In addition, according to the present disclosure, there is provided a semiconductor storage device including: a plurality of semiconductor storage elements arranged in a matrix, the plurality of semiconductor storage elements each including a memory cell transistor including a gate insulator film at least partially including ferroelectric material, and a selection transistor provided in such a manner that one of a source or a drain is connected with a gate electrode of the memory cell transistor via a connection layer, and a gate insulator film faces the gate insulator film of the memory cell transistor in a layer stack direction across the connection layer.

Furthermore, according to the present disclosure, there is provided a semiconductor system including: a storage device including a plurality of semiconductor storage elements arranged in a matrix and each including a memory cell transistor including a gate insulator film at least partially including ferroelectric material, and a selection transistor provided in such a manner that one of a source or a drain is connected with a gate electrode of the memory cell transistor via a connection layer, and a gate insulator film faces the gate insulator film of the memory cell transistor in a layer stack direction across the connection layer; and an arithmetic device connected with the storage device. The storage device and the arithmetic device are mounted on one semiconductor chip.

According to the present disclosure, because a memory cell transistor and a selection transistor can be provided with being stacked so as to face each other in a thickness direction, a planar area can be more reduced.

Advantageous Effects of Invention

As described above, according to the present disclosure, there can be provided a semiconductor storage element, a semiconductor storage device, and semiconductor system that have more reduced planar areas.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 10 is a plane view and a cross-sectional view describing each process of manufacturing of the semiconductor storage element according to the embodiment.

MODE(S) FOR CARRYING OUT THE INVENTION

Figure 1:
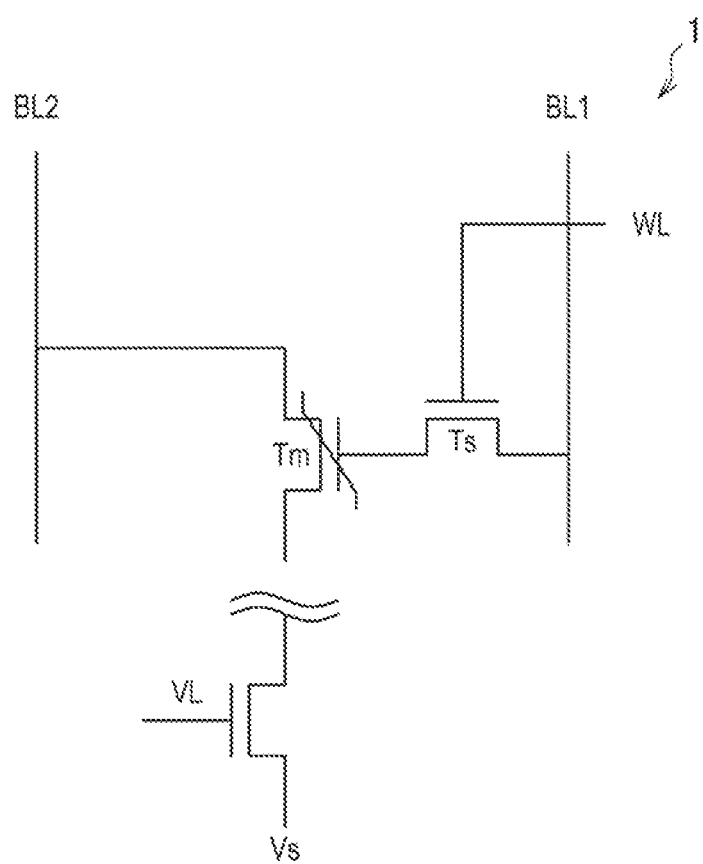
FIG. 1 is a circuit diagram illustrating an equivalent circuit of a semiconductor storage element according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that, the description will be given in the following order.

1. Overview of Semiconductor Storage Element
2. Structure of Semiconductor Storage Element
3. Operation of Semiconductor Storage Element
4. Manufacturing Method of Semiconductor Storage Element
5. Conclusion

1. OVERVIEW OF SEMICONDUCTOR STORAGE ELEMENT

First of all, an overview of a semiconductor storage element according to an embodiment of the present disclosure will be described with reference to FIG. 1. FIG. 1 is a circuit diagram illustrating an equivalent circuit of a semiconductor storage element 1 according to the present embodiment of the present disclosure.

Note that, in this specification, a "gate" represents a gate electrode of a field effect transistor, a "drain" represents a drain electrode or a drain region of a field effect transistor, and a "source" represents a source electrode or a source region of a field effect transistor.

As illustrated in FIG. 1, the semiconductor storage element 1 includes a memory cell transistor Tm and a selection transistor Ts connecting with a gate of the memory cell transistor Tm.

The memory cell transistor Tm is a field effect transistor including a gate insulator film at least partially including ferroelectric material, and stores information in a direction of residual polarization of the gate insulator film. In addition, the memory cell transistor Tm connects with a second bit line BL2 at one of a source or a drain, and connects with a power source Vs provided on the outside of the semiconductor storage element 1, via a transistor VL at the other one of the source or the drain. Note that the power source Vs may be a ground (GND).

The selection transistor Ts is a field effect transistor functioning as a switching element, and connects with the gate of the memory cell transistor Tm at one of a source or a drain and connects with a first bit line BL1 at the other one of the source or the drain. In addition, a gate of the selection transistor Ts connects with a word line WL, and a channel of the selection transistor Ts is controlled by applied voltage from the word line WL.

Accordingly, in the case of writing information into the memory cell transistor Tm, in the semiconductor storage element 1, first of all, voltage is applied to the word line WL, and the channel of the selection transistor Ts is turned on. Next, by applying a predetermined electric potential difference to the first bit line BL1 and the second bit line BL2, an electric field is applied to a gate insulator film of the memory cell transistor Tm. In the semiconductor storage element 1, a direction of residual polarization of the gate insulator film of the memory cell transistor Tm can be thereby controlled by an external electric field, and information can be written into the memory cell transistor Tm.

On the other hand, in the case of reading out information from the memory cell transistor Tm, in the semiconductor storage element 1, first of all, voltage is applied to the word line WL to turn on the channel of the selection transistor Ts, and then, voltage is applied to the first bit line BL1 to thereby turn on a channel of the memory cell transistor Tm. After that, by applying voltage to the second bit line BL2 after a channel of the transistor VL is turned on, current is flowed from the drain to the source of the memory cell transistor Tm. In the memory cell transistor Tm, because a threshold voltage Vt varies depending on the direction of residual polarization of the gate insulator film, by measuring the magnitude of current flowing from the drain to the source, information stored in the memory cell transistor Tm can be read out.

In other words, the semiconductor storage element 1 according to the present embodiment can operate as a ferroelectric random access memory (FeRAM) that stores information into the memory cell transistor Tm.

In the semiconductor storage element 1, because the selection transistor Ts is connected to the gate of the memory cell transistor Tm, whether to apply an electric field to the gate insulator film of the memory cell transistor Tm or not can be controlled by on/off of the selection transistor Ts. Accordingly, in the semiconductor storage element 1, in both of the case of writing information into a selected memory cell transistor Tm, and the case of reading out information therefrom, an external electric field can be prevented from being applied to a gate insulator film of an unselected memory cell transistor Tm.

The semiconductor storage element 1 can thereby prevent information stored in the unselected memory cell transistor Tm, from being rewritten by the writing and readout of information. In addition, in the semiconductor storage element 1, at the time of writing and readout of information, because an electric field can be applied only to the gate insulator film of the selected memory cell transistor Tm, the degradation of ferroelectric material forming the gate insulator film can be suppressed.

Furthermore, by providing the above-described memory cell transistor Tm and the selection transistor Ts so as to face each other in a layer stack direction, the semiconductor storage element 1 according to the present embodiment can reduce a planar area occupied by the semiconductor storage element 1. Hereinafter, a specific structure of the semiconductor storage element 1 will be described.

2. STRUCTURE OF SEMICONDUCTOR STORAGE ELEMENT

Figure 2:
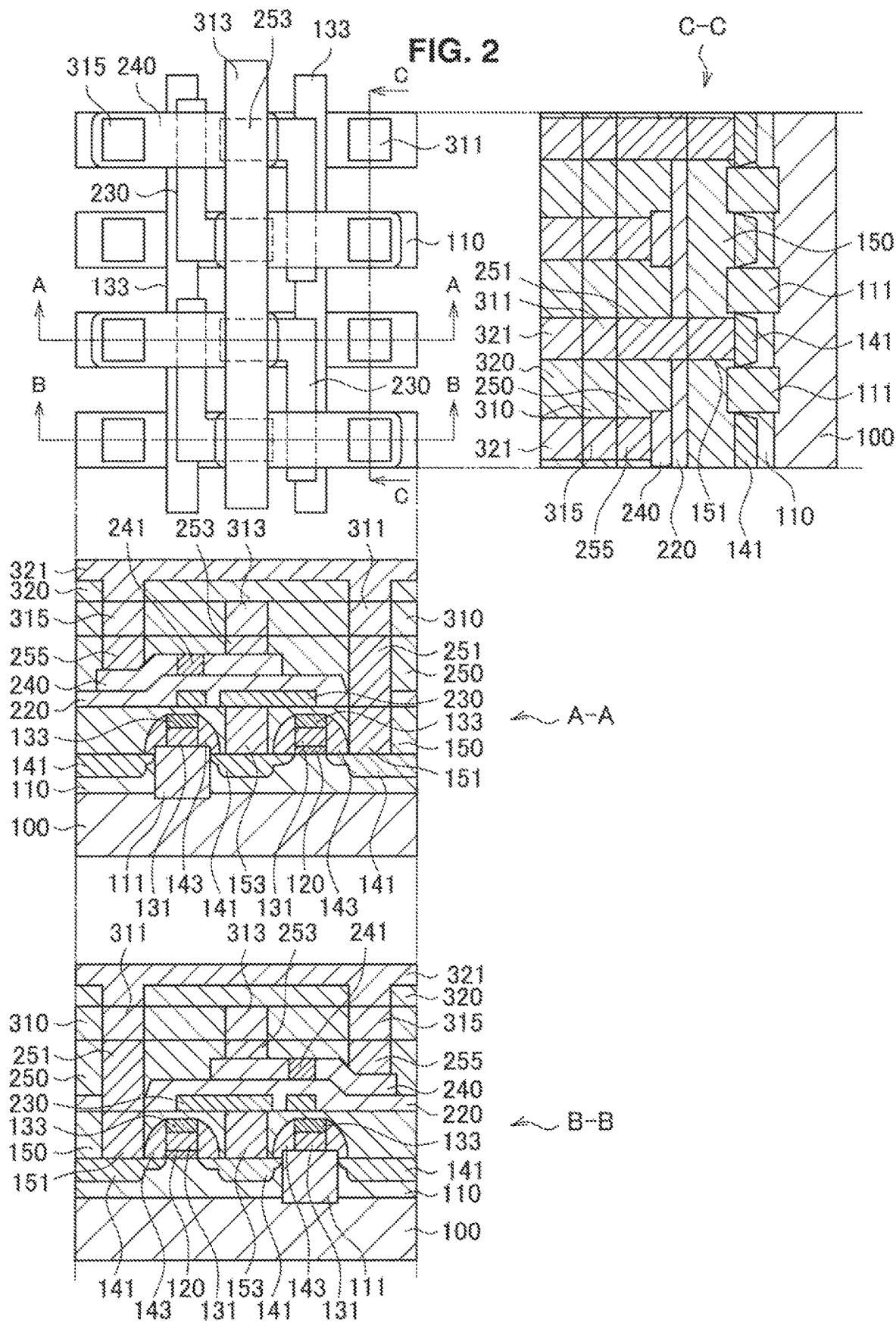
FIG. 2 is an explanatory diagram illustrating a planar structure and a cross-sectional structure of the semiconductor storage element according to the embodiment.

Subsequently, a specific structure of the semiconductor storage element 1 according to the present embodiment will be described with reference to FIG. 2. FIG. 2 is an explanatory diagram illustrating a planar structure and a cross-sectional structure of the semiconductor storage element 1 according to the present embodiment.

Note that each cross-sectional view in FIG. 2 illustrates a cross-section obtained by cutting a plane view along an AA line, a BB line, or a CC line. Nevertheless, in the plane view in FIG. 2, for clearly indicating the arrangement of each configuration, the illustration of a layer formed over the entire surface of a semiconductor substrate 100 is omitted, and the illustration of a third interlayer insulating film 320 and a second wiring layer 321 is omitted.

Hereinafter, a "first conductivity type" represents one of a "p-type" or an "n-type", and a "second conductivity type" represents the other one of the "p-type" and "n-type" that is different from the "first conductivity type".

As illustrated in FIG. 2, the semiconductor storage element 1 is provided on the semiconductor substrate 100. Specifically, by a gate insulator film 120 and a gate electrode 131 being provided on activation regions 110 provided in a partial region of the semiconductor substrate 100, the selection transistor Ts is formed. In addition, a gate insulator film 220 including ferroelectric material is provided on one end of a connection layer 230 connecting with a source/drain region 141 of the selection transistor Ts and functioning as a gate electrode of the memory cell transistor Tm, and a semiconductor layer 240 is provided on the gate insulator film 220, whereby the memory cell transistor Tm is formed.

By the selection transistor Ts and the memory cell transistor Tm that have been described above, the semiconductor storage element 1 including the equivalent circuit illustrated in FIG. 1 is formed. In addition, by a number of semiconductor storage elements 1 being arranged in a matrix on the semiconductor substrate 100, a highly-integrated and large-capacity semiconductor storage device can be formed.

Hereinafter, the description will be given mainly based on the plane view, an A-A cross-sectional view, and a C-C cross-sectional view in FIG. 2. Note that a B-B cross-sectional view is substantially the same as a drawing obtained by horizontally inverting the A-Across-sectional view.

The semiconductor substrate 100 is a substrate on which the selection transistor Ts is to be formed. As the semiconductor substrate 100, a substrate including various semiconductors may be used, and for example, a substrate including polycrystalline, monocrystalline, or amorphous silicon (Si) may be used. In addition, the semiconductor substrate 100 may use a Silicon On Insulator (SOI) substrate in which an insulating film such as $SiO_2$ is sandwiched in a silicon substrate.

The activation regions 110 are regions of the first conductivity type that are formed on the semiconductor substrate 100, and are provided as parallel band-like regions separated from each other by element separation regions 111. In addition, by being separated from each other by the element separation regions 111, band-like regions of the activation regions 110 prevent adjacent selection transistors Ts from conducting electricity to each other. For example, the activation regions 110 may be formed by introducing an impurity of the first conductivity type (e.g. p-type impurity such as boron (B)) to the semiconductor substrate 100.

The element separation region 111 is an insulating region formed on the semiconductor substrate 100, and electrically separates selection transistors Ts provided on the activation regions 110, from each other, by electrically separating the activation regions 110 from each other. For example, the element separation region 111 may include an insulating oxynitride such as silicon oxide ($SiO_x$), silicon nitride ($SiN_x$), or silicon oxynitride (SiON).

Specifically, the element separation region 111 may be formed by removing a part of the semiconductor substrate 100 in a desired region, by etching or the like, using a Shallow Trench Isolation (STI) method, and then, filling an opening formed by the etching, with silicon oxide ($SiO_x$). In addition, the element separation region 111 may be formed by thermally oxidizing the semiconductor substrate 100 in a predetermined region, and performing conversion into an oxide, using a Local Oxidation of Silicon (LOCOS) method.

The gate insulator film 120 is a gate insulator film of the selection transistor Ts. Accordingly, the gate insulator film 120 is provided only on the activation region 110, and not provided on the element separation regions 111. This prevents an unintended region from functioning as a transistor in the semiconductor storage element 1.

In addition, the selection transistor Ts functions as a switching element that controls voltage application to the memory cell transistor Tm. Thus, the gate insulator film 120 may include known insulating material that is common as a gate insulator film of a field effect transistor. For example, the gate insulator film 120 may include an insulating oxynitride such as silicon oxide ($SiO_x$), silicon nitride ($SiN_x$), or silicon oxynitride (SiON). Nevertheless, it should be appreciated that the gate insulator film 120 may include dielectric material such as hafnium oxide, or ferroelectric material, if the selection transistor Ts functions as a switching element.

The gate electrode 131 is a gate electrode of the selection transistor Ts and is provided on the gate insulator film 120. In addition, the gate electrode 131 is extended in a direction orthogonal to an extending direction of the activation regions 110, and is provided over the plurality of activation regions 110 over the element separation regions 111. The gate electrode 131 functions as the word line WL that electrically connects gate electrodes of the respective selection transistors Ts of the semiconductor storage elements 1. At this time, the gate electrode 131 is provided also on the element separation regions 111, but because the gate insulator film 120 is not provided on the element separation regions 111, the gate electrode 131 implements a function as wiring of the word line WL on the element separation regions 111.

For example, the gate electrode 131 may include polysilicon or the like, or may include metal, an alloy, or a metal compound. In addition, the gate electrode 131 may be formed into a layer stack structure including a plurality of layers including a metal layer, and a layer including polysilicon. For example, the gate electrode 131 may be formed into a layer stack structure including a metal layer including TiN or TaN that is provided on the gate insulator film 120, and a layer including polysilicon. According to such a layer stack structure, the gate electrode 131 can reduce interconnection resistance as compared with the case of including a polysilicon single layer.

The source/drain regions 141 are regions of the second conductivity type that are formed on the semiconductor substrate 100, and function as a source region or a drain region of the selection transistor Ts. Specifically, the source/drain regions 141 are provided in the activation regions 110 on the both sides across the gate electrode 131. One of the source/drain regions 141 connects with the second wiring layer 321 functioning as the first bit line BL1 and the second bit line BL2, via a first contact plug 151 and a second contact plug 251. In addition, the other one of the source/drain regions 141 connects with the connection layer 230 functioning as a gate electrode of the memory cell transistor Tm, via a first contact plug 153.

For example, the source/drain regions 141 may be formed by introducing an impurity of the second conductivity type (e.g. n-type impurity such as phosphorus (P) and arsenic (As)) to a predetermined region of the activation region 110. In addition, a Lightly-Doped Drain (LDD) region having the same conductivity type as the source/drain region 141, and having lower concentration than the source/drain region 141 may be formed between the source/drain region 141 and the gate electrode.

Note that whichever of the source/drain regions 141 formed across the gate electrode 131 may function as a source region, and whichever thereof may function as a drain region. These can be arbitrarily changed in accordance with the direction of current flowing in a selection transistor Tr.

The side wall insulating films 143 are side walls with insulating films that are provided on the side surfaces of the gate electrodes 131. Specifically, the side wall insulating films 143 may be formed by forming insulating films in a region including the gate electrodes 131, and then performing etching having perpendicular anisotropy to the insulating films. For example, each of the side wall insulating films 143 may include a single layer or a plurality of layers that includes an insulating oxynitride such as silicon oxide ($SiO_x$), silicon nitride ($SiN_x$), or silicon oxynitride (SiON).

By blocking an impurity to be introduced into the activation regions 110, the side wall insulating films 143 control in a self-aligning manner a positional relationship between the gate electrode 131 and the source/drain region 141 into which an impurity is to be introduced. In addition, in a case where each of the side wall insulating films 143 includes a plurality of layers, the introduction of an impurity into the activation regions 110 can be performed in a step-by-step manner. Thus, an LDD region can be formed in a self-aligning manner between the source/drain region 141 and the gate electrode 131.

A contact layer 133 is provided on the top surface of the gate electrode 131, and enhances conductivity of the gate electrode 131. Specifically, the contact layer 133 may include low-resistance metal, a metal compound, or an alloy (so-called silicide) of high melting point metal such as Ni, and a semiconductor forming the gate electrode 131. For example, the contact layer 133 may include a high melting point metal silicide such as NiSi.

A planarization film 150 is an insulating film that buries the selection transistor Ts and is provided over the entire surface of the semiconductor substrate 100. In addition, the memory cell transistor Tm is stacked on the planarization film 150. For example, the planarization film 150 may include an insulating oxynitride such as silicon oxide ($SiO_x$), silicon nitride ($SiN_x$), or silicon oxynitride (SiON).

Note that a liner layer including inorganic insulating material may be provided between the gate electrode 131 and the planarization film 150 over the entire surface of the semiconductor substrate 100, which is not illustrated in FIG. 2. The liner layer can prevent etching from excessively progressing in the semiconductor substrate 100, by providing a high etching selection ratio with the planarization film 150, when the first contact plugs 151 and 153 are formed. For example, the liner layer may include an insulating oxynitride such as silicon oxide ($SiO_x$), silicon nitride ($SiN_x$), or silicon oxynitride (SiON). Specifically, in a case where the planarization film 150 is silicon oxide ($SiO_x$), the liner layer may include silicon nitride ($SiN_x$).

In addition, the liner layer may be formed as a layer that adds compressional stress or tensile stress to the gate insulator film 120. In such a case, the liner layer can enhance carrier mobility of the gate insulator film 120 by a stress effect.

The first contact plugs 151 and 153 are provided to penetrate through the planarization film 150. Specifically, the first contact plug 151 electrically connects one of the source/drain regions 141 and the second wiring layer 321 via the second contact plug 251 provided on the first contact plug 151, and a first wiring layer 311. In addition, the first contact plug 153 electrically connects the other one of the source/drain regions 141 and the connection layer 230.

For example, the first contact plugs 151 and 153 may include low-resistance metal such as titanium (Ti) or tungsten (W), or a metal compound such as titanium nitride (TiN). In addition, each of the first contact plugs 151 and 153 may include a single layer or may include a layer stack member including a plurality of layers. For example, the first contact plugs 151 and 153 may include a layer stack member including Ti or TiN, and W.

Here, as described later, the selection transistor Ts and the memory cell transistor Tm are formed in different planar regions when planarly viewed from a layer stack direction. The first contact plug 151 can thereby connect with the second wiring layer 321 via the second contact plug 251 and the first wiring layer 311 without interfering with each configuration of the memory cell transistor Tm even in the case of being vertically provided on the source/drain region 141.

The connection layer 230 connects with one of the source/drain regions 141 of the selection transistor Ts via the first contact plug 153, and functions as a gate electrode of the memory cell transistor Tm. Specifically, the connection layer 230 is provided on the planarization film 150 in a hook-like shape in which a straight line is bent at at least one or more bending points, and connects with the first contact plug 153 at one end of the hook-like shape. For example, the connection layer 230 may be provided on the planarization film 150 in an "L" shape in which a straight line is orthogonally bent.

By the connection layer 230 being provided in the above-described planar shape, the selection transistor Ts and the memory cell transistor Tm are formed in different planar regions when planarly viewed from the layer stack direction. With this configuration, a second contact plug 255 connecting with the other one of the source/drain regions of the selection transistor Ts, a second contact plug 253 connecting with the other one of the source/drain regions of the memory cell transistor Tm, and the second contact plug 251 connecting with one of the source/drain regions of the memory cell transistor Tm can be arranged in a matrix in the semiconductor storage element 1 so as not to interfere with each other. In addition, with this configuration, each configuration of the memory cell transistor Tm is not provided on the first contact plug 151. Thus, the other one of the source/drain regions of the selection transistor Ts and the second wiring layer 321 can be linearly connected without laying wires or the like.

Accordingly, by the connection layer 230 being formed in the above-described planar shape, the semiconductor storage element 1 can efficiently stack the selection transistor Ts and the memory cell transistor Tm.

The connection layer 230 may include polysilicon or the like, or may include metal, an alloy, or a metal compound. For example, the connection layer 230 may include a metal compound such as TiN or TaN. Nevertheless, in a case where the connection layer 230 includes metal, an alloy, or a metal compound, because an oxidized film is difficult to be formed on the surface of the connection layer 230, it becomes possible to control a crystal property and orientation of ferroelectric material forming the gate insulator film 220, on the basis of the material of the connection layer 230. In addition, because the gate insulator film 220 can include a monolayer film including ferroelectric material, by enhancing a polarization property of the gate insulator film 220, a memory property of the memory cell transistor Tm can be enhanced.

The gate insulator film 220 is a gate insulator film of the memory cell transistor Tm, and is provided on the connection layer 230. The gate insulator film 220 at least partially includes ferroelectric material which spontaneously polarizes, and of which a direction of polarization can be controlled in an external electric field. For example, the gate insulator film 220 may include ferroelectric material having a perovskite structure such as lead zirconium titanate (Pb (Zr, Ti) $O_3$: PZT), or strontium bismuth tantalite ($SrBi_2Ta_2O_9$: SBT). In addition, the gate insulator film 220 may include a ferroelectric film obtained by transubstantiating, by thermal treatment or the like, a film including high-dielectric material such as $HfO_x$, $ZrO_x$, or $HfZrO_x$, or may include a ferroelectric film formed by doping a film including the above-described high-dielectric materials, with an atom such as lanthanum (La), silicon (Si), or gadolinium (Gd). In addition, the gate insulator film 220 may include a single layer or may include a plurality of layers. For example, the gate insulator film 220 may include a monolayer film including ferroelectric material such as $HfO_x$.

The semiconductor layer 240 is a layer in which a channel region 241 and source/drain regions of the memory cell transistor Tm are formed, and is provided on the gate insulator film 220 by semiconductive material. Specifically, the semiconductor layer 240 is provided on the gate insulator film 220 in a planar arrangement in which a part thereof overlaps the connection layer 230, when planarly viewed in the layer stack direction.

For example, the semiconductor layer 240 may include polycrystalline, monocrystalline, or amorphous silicon (Si), may include a compound semiconductor such as germanium (Ge), gallium arsenide (GaAs), or indium gallium arsenide (InGaAs), may include an oxide semiconductor such as zinc oxide (ZnO) or indium gallium tin oxide (InGaZnO), or may include a two-dimensional semiconductor such as molybdenum sulfide ($MoS_2$).

In a region of the semiconductor layer 240 that overlaps one end of the connection layer 230 that is unconnected with the first contact plug 153 (i.e. a region in which a channel is formed), when planarly viewed in the layer stack direction, in a case where voltage is applied to the connection layer 230, a channel is formed by a carrier accumulation layer being formed. On the other hand, in regions of the semiconductor layer 240 that are provided on the both sides of the region in which the channel is formed, source/drain regions are formed by introducing an impurity of the second conductivity type (e.g. n-type impurity such as phosphorus (P) and arsenic (As)).

Accordingly, the memory cell transistor Tm includes the connection layer 230, the gate insulator film 220, and the semiconductor layer 240 that have been described above. In other words, the memory cell transistor Tm is formed as a thin film transistor (TFT) in which the source/drains formed in the semiconductor layer 240, and the connection layer 230 serving as a gate electrode are provided on the opposite sides across the gate insulator film 220. In addition, the memory cell transistor Tm is formed as a bottom gate transistor in which the connection layer 230 serving as a gate electrode is provided below the gate insulator film 220. The semiconductor storage element 1 can thereby reduce a planar area to be occupied.

A first interlayer insulating film 250 buries the memory cell transistor Tm and is provided over the entire surface of the semiconductor substrate 100. For example, the first interlayer insulating film 250 may include an insulating oxynitride such as silicon oxide ($SiO_x$), silicon nitride ($SiN_x$), or silicon oxynitride (SiON).

The second contact plugs 251, 253, and 255 are provided to penetrate through the first interlayer insulating film 250. Specifically, the second contact plug 251 is provided on the first contact plug 151, and electrically connects one of the source/drain regions 141 of the selection transistor Ts and the second wiring layer 321 via the first wiring layer 311. In addition, the second contact plug 253 electrically connects one of the source/drain regions of the memory cell transistor Tm and a first wiring layer 313. Furthermore, in addition, the second contact plug 255 electrically connects the other one of the source/drain regions of the memory cell transistor Tm and the second wiring layer 321 via a first wiring layer 315.

For example, the second contact plugs 251, 253, and 255 may include low-resistance metal such as titanium (Ti) or tungsten (W), or a metal compound such as titanium nitride (TiN). In addition, each of the second contact plugs 251, 253, and 255 may include a single layer or may include a layer stack member including a plurality of layers. For example, the second contact plugs 251, 253, and 255 may include a layer stack member including Ti or TiN, and W.

The first wiring layers 311, 313, and 315 are respectively provided on the second contact plugs 251, 253, and 255. Specifically, the first wiring layers 311 and 315 are respectively provided only on the second contact plugs 251 and 255. In addition, the first wiring layer 313 is provided on the second contact plug 253 with extending in a direction orthogonal to the extending direction of the activation regions 110. The first wiring layer 313 thereby electrically connects the second contact plug 253 (i.e. the other one of the source or the drain of the memory cell transistor Tm of each of the semiconductor storage elements 1), the transistor VL (not illustrated), and the power source Vs (not illustrated). For example, the first wiring layers 311, 313, and 315 may include metal material such as copper (Cu) and aluminum (Al), or may include a damascene structure or dual damascene structure of Cu.

A second interlayer insulating film 310 buries the first wiring layers 311, 313, and 315, and is provided on the first interlayer insulating film 250 over the entire surface of the semiconductor substrate 100. The second interlayer insulating film 310 may include an insulating oxynitride such as silicon oxide ($SiO_x$), silicon nitride ($SiN_x$), or silicon oxynitride (SiON), for example.

The third interlayer insulating film 320 is provided on the second interlayer insulating film 310 over the entire surface of the semiconductor substrate 100. The third interlayer insulating film 320 may include an insulating oxynitride such as silicon oxide ($SiO_x$), silicon nitride ($SiN_x$), or silicon oxynitride (SiON), for example.

The second wiring layer 321 is provided on the third interlayer insulating film 320 with extending in a direction parallel to the extending direction of the activation regions 110. In addition, the second wiring layer 321 has contacts penetrating through the third interlayer insulating film 320, and electrically connects the first wiring layers 311 and 315.

Specifically, the second wiring layer 321 electrically connects the other one of the source or the drain of the memory cell transistor Tm of each of the semiconductor storage elements 1, and the other one of the source/drain regions 141 of the selection transistor Ts, and functions as the first bit line BL1 and the second bit line BL2. For example, the second wiring layer 321 may include metal material such as copper (Cu) and aluminum (Al), or may include a damascene structure or dual damascene structure of Cu.

According to the above-described structure, in the semiconductor storage element 1, the gate insulator film 120 of the selection transistor Ts and the gate insulator film 220 of the memory cell transistor Tm 220 are provided with facing in the layer stack direction across the connection layer 230, whereby the selection transistor Ts and the memory cell transistor Tm are stacked. The semiconductor storage element 1 can thereby more reduce a planar area to be occupied.

Therefore, in the semiconductor storage elements 1 according to the present embodiment, the semiconductor storage elements 1 that can prevent application of voltage to an unselected storage element, and can apply voltage only to a selected storage element can be formed in a more reduced planar area. With this configuration, because it is possible to enhance an integration degree of the semiconductor storage elements 1, it is possible to enhance storage density of the semiconductor storage device in which the semiconductor storage elements 1 are integrated.

3. OPERATION OF SEMICONDUCTOR STORAGE ELEMENT

Subsequently, a writing operation or readout operation of the semiconductor storage element 1 described with reference to FIGS. 1 and 2 will be described. Table 1 provided below is a table that shows an example of voltage to be applied to each line in the writing operation or readout operation of the semiconductor storage element 1.

TABLE 1

| | Word line WL | First bit line BL1 | Second bit line BL2 | Gate of transistor VL |
|---|---|---|---|---|
| "1" writing | 3.5 V | 3.0 V | 0 V | 0 V |
| "0" writing | 3.5 V | 0 V | 3.0 V | 0 V |
| Readout | 1.5 V | 1.0 V | 1.0 V | 1.0 V |

As shown in Table 1, in the case of writing information of "1" into the semiconductor storage element 1, for example, 3.5 V is applied to the word line WL connecting to the selected semiconductor storage element 1, 3.0 V is applied to the first bit line BL1, and 0 V is applied to the second bit line BL2. In addition, by applying 0 V to a gate of the transistor VL controlling the connection to the power source Vs, a channel of the transistor VL is turned off.

At this time, an electric potential of the first bit line BL1 is transmitted to the gate of the memory cell transistor Tm via the selection transistor Ts having the turned-on channel. In addition, an electric potential of the second bit line BL2 is transmitted to the source and drain of the memory cell transistor Tm. With this configuration, because an external electric field having a high electric potential gate side is applied to the gate insulator film 220 of the memory cell transistor Tm, a polarized state of the gate insulator film 220 is controlled, and the information of "1" is written into the semiconductor storage element 1, for example.

On the other hand, for example, in the case of writing information of "0" into the semiconductor storage element 1, 3.5 V is applied to the word line WL connecting to the selected semiconductor storage element 1, 0 V is applied to the first bit line BL1, and 3.0 V is applied to the second bit line BL2. In addition, by applying 0 V to a gate of the transistor VL controlling the connection to the power source Vs, a channel of the transistor VL is turned off.

At this time, an electric potential of the first bit line BL1 is transmitted to the gate of the memory cell transistor Tm via the selection transistor Ts, and an electric potential of the second bit line BL2 is transmitted to the source and drain of the memory cell transistor Tm. With this configuration, because an external electric field having high electric potential source and drain sides is applied to the gate insulator film 220 of the memory cell transistor Tm, a polarized state of the gate insulator film 220 is controlled, and the information of "0" is written into the semiconductor storage element 1, for example.

Note that, in an unselected semiconductor storage element 1 connecting to the word line WL, because voltage is not applied to the first bit line BL1 and the second bit line BL2, an electric field is not applied to the gate insulator film 220 of the memory cell transistor Tm. In addition, in an unselected semiconductor storage element 1 connecting to the first bit line BL1 and the second bit line BL2, because channels of the selection transistors Ts are turned off although voltage is applied to the first bit line BL1 and the second bit line BL2, an electric field is not applied to the gate insulator film 220 of the memory cell transistor Tm.

In addition, in the case of reading out information from the semiconductor storage element 1, 1.5 V is applied to the word line WL connecting to the selected semiconductor storage element 1, 1.0 V is applied to the first bit line BL1, and 1.0 V is applied to the second bit line BL2. In addition, by applying 1.0 V to the gate of the transistor VL controlling the connection to the power source Vs, the channel of the transistor VL is turned on.

At this time, in the memory cell transistor Tm, because an electric potential of the first bit line BL1 is transmitted to the gate via the selection transistor Ts, the channel of the memory cell transistor Tm is turned on. In the memory cell transistor Tm, the threshold voltage Vt varies depending on the direction of residual polarization of the gate insulator film 220, and for example, in a case where the information of "1" is stored in the above operation, Vt become low, and in a case where information of "0" is stored in the above operation, Vt becomes high. With this configuration, because an amount of current flowing from the second bit line BL2 to the power source Vs (or grand) varies depending on the direction of residual polarization of the gate insulator film 220 of the memory cell transistor Tm, it can be thereby determined whether information stored in the memory cell transistor Tm is "1" or "0".

Note that, in an unselected semiconductor storage element 1 connecting to the word line WL, because voltage is not applied to the first bit line BL1 and the second bit line BL2, an electric field is not applied to the memory cell transistor Tm. In addition, in an unselected semiconductor storage element 1 connecting to the first bit line BL1 and the second bit line BL2, because channels of the selection transistors Ts are turned off although voltage is applied to the first bit line BL1 and second bit line BL2, an electric field is not applied to the memory cell transistor Tm.

Therefore, in the semiconductor storage element 1, because the selection transistors Ts functioning as switching elements are connected to the gate of the memory cell transistor Tm that stores information, the semiconductor storage element 1 can selectively apply an external electric field to the gate insulator film. With this configuration, in the semiconductor storage element 1, information stored in an unselected semiconductor storage element can be prevented from being deranged (also referred to as disturb) when information is written into or read out from the selected semiconductor storage element 1.

In addition, for example, when information is read out, in a case where leak current of the memory cell transistor Tm that is generated along the second bit line BL2 is larger than current flowing from the second bit line BL2 to the power source Vs, determination of stored information has sometimes become difficult. In the semiconductor storage element 1, by setting, to 0 V, the gate of the transistor VL connecting to an unselected memory cell transistor Tm provided along the second bit line BL2, the connection between the unselected memory cell transistor Tm and the power source Vs can be disconnected. With this configuration, in the semiconductor storage element 1, leak current generated along the second bit line BL2 and flowing via the unselected memory cell transistor Tm can be cut off. With this configuration, the semiconductor storage element 1 can perform determination of stored information more surely.

4. MANUFACTURING METHOD OF SEMICONDUCTOR STORAGE ELEMENT

Next, a manufacturing method of the semiconductor storage element 1 according to the present embodiment will be described with reference to FIGS. 3 to 10. FIGS. 3 to 10 are plane views and cross-sectional views describing each manufacturing process of the semiconductor storage element 1 according to the present embodiment.

Note that, also in FIGS. 3 to 10, for clearly indicating the arrangement of each configuration similarly to FIG. 2, the illustration of a layer formed over the entire surface of the semiconductor substrate 100 is omitted. In addition, each cross-sectional view illustrates a cross-section obtained by cutting a plane view along an AA line, a BB line, or a CC line.

Figure 3:
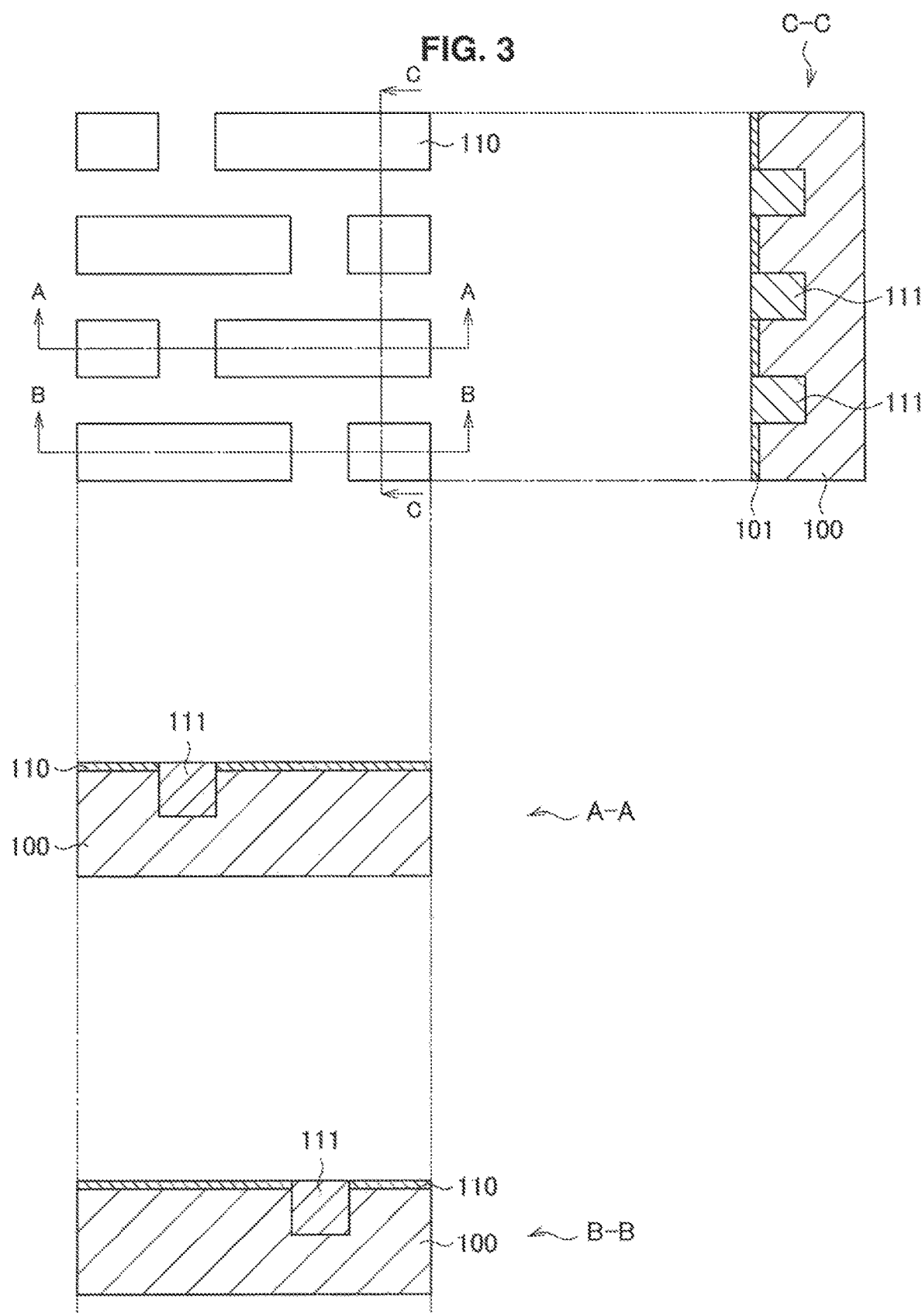
FIG. 3 is a plane view and a cross-sectional view describing each process of manufacturing of the semiconductor storage element according to the embodiment.

First of all, as illustrated in FIG. 3, the activation regions 110 and the element separation regions 111 are formed on the semiconductor substrate 100.

Specifically, a $SiO_2$ film is formed by dry oxidation or the like, on the semiconductor substrate 100 including Si, and furthermore, a $Si_3N_4$ film is formed by a low-pressure Chemical Vapor Deposition (CVD) method or the like. Subsequently, a resist layer patterned so as to protect a region to be the activation regions 110 in a subsequent stage is formed on the $Si_3N_4$ film, and the $SiO_2$ film, the $Si_3N_4$ film, and the semiconductor substrate 100 are etched in a depth of 350 nm to 400 nm.

Next, for filling an opening formed by etching, $SiO_2$ is formed into a film having a film thickness of 650 nm to 700 nm, and the element separation regions 111 are formed. For example, a high-density plasma CVD method can be used for the film formation of $SiO_2$. According to this method, a $SiO_2$ film that has good unevenness coatability, and is precise can be formed.

Subsequently, the surface of the semiconductor substrate 100 is planarized by removing the excessively-formed $SiO_2$ film using a Chemical Mechanical Polish (CMP) method or the like. The removal of the $SiO_2$ film using the CMP may be performed until the $Si_3N_4$ film is exposed, for example.

Furthermore, the $Si_3N_4$ film is removed using hot phosphoric acid or the like. Note that, before the removal of the $Si_3N_4$ film, the semiconductor substrate 100 may be annealed under an $N_2$, $O_2$, or $H_2/O_2$ environment, for making the $SiO_2$ film of the element separation region 111 into a more precise film, or for rounding corners of the activation regions 110.

Next, the activation regions 110 of the first conductivity type are formed by ion-implanting an impurity of the first conductivity type (e.g. boron, etc.) after oxidizing a region of the semiconductor substrate 100 that corresponds to the activation regions 110, by about 10 nm.

Figure 4:
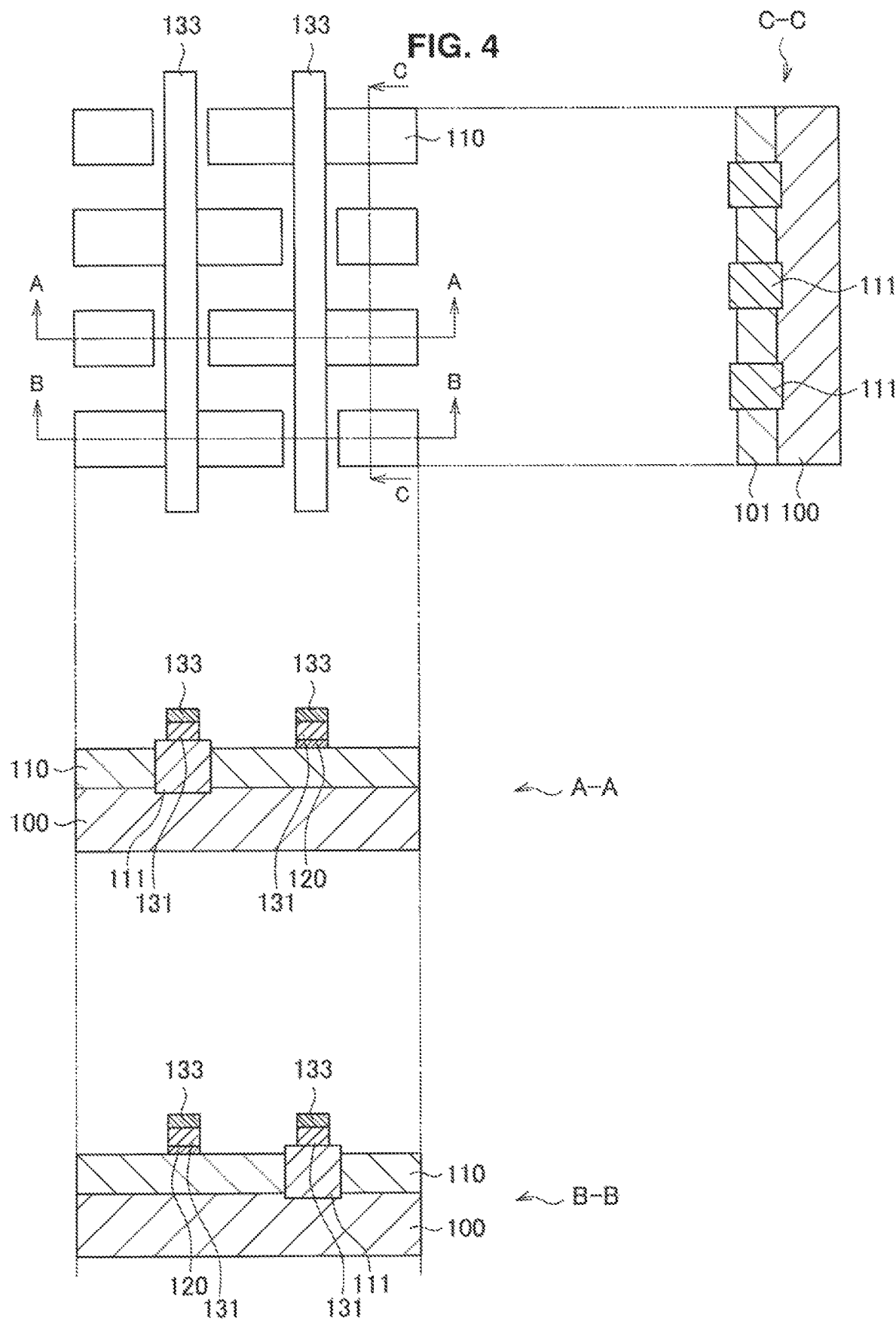
FIG. 4 is a plane view and a cross-sectional view describing each process of manufacturing of the semiconductor storage element according to the embodiment.

Next, as illustrated in FIG. 4, after the gate insulator film 120 is formed, the gate electrode 131 and the contact layer 133 are formed on the gate insulator film 120.

Specifically, first of all, the $SiO_2$ film covering the surface of the semiconductor substrate 100 is peeled off using hydrofluoric acid solution or the like. After that, a $SiO_2$ film serving as the gate insulator film 120 is formed on the semiconductor substrate 100 into a film thickness of 0.5 nm to 2.0 nm using dry oxidation that uses dry oxygen of 700° C., Rapid Thermal Anneal (RTA) treatment, or the like. Note that, as gas used for dry oxidation, aside from dry oxygen, mixed gas of $H_2/O_2$, $N_2O$, or NO can also be used.

In addition, when the gate insulator film 120 is formed, nitrogen doping can also be performed in the $SiO_2$ film by using plasma nitridation. Furthermore, by partially forming the gate insulator film 120 having a film thickness of 3 nm to 5 nm, field effect transistors having different applied voltages or threshold voltages can also be separately created in the plane of the semiconductor substrate 100.

Next, using a low-pressure CVD method that sets raw material gas to $SiH_4$ gas and a film formation temperature to 580° C. to 620° C., polysilicon is formed into a film having a film thickness of 50 nm to 150 nm. Subsequently, using Physical Vapor Deposition (PVD) method or a CVD method, TiN is formed into a film having a film thickness of 50 nm to 100 nm. Furthermore, by performing anisotropic etching with respect to polysilicon and TiN with HBr gas or Cl-based gas using a patterned resist, as a mask, the gate electrode 131 and the contact layer 133 are formed.

Note that the gate insulator film 120 can be formed not by the above-described insulating oxidized film but by a high dielectric film such as $HfO_2$. In addition, the contact layer 133 may include another low-resistance metal, a metal compound, or a silicide, or may include W, $WSi_x$, or the like.

In addition, a width of the gate electrodes 131 and the contact layers 133 to be formed after the anisotropic etching can be made thinner by performing trimming treatment of the resist by $O_2$ plasma after patterning the resist. For example, in a 32-nm process node, a width (gate length) of the gate electrodes may be set to 20 nm to 30 nm.

Figure 5:
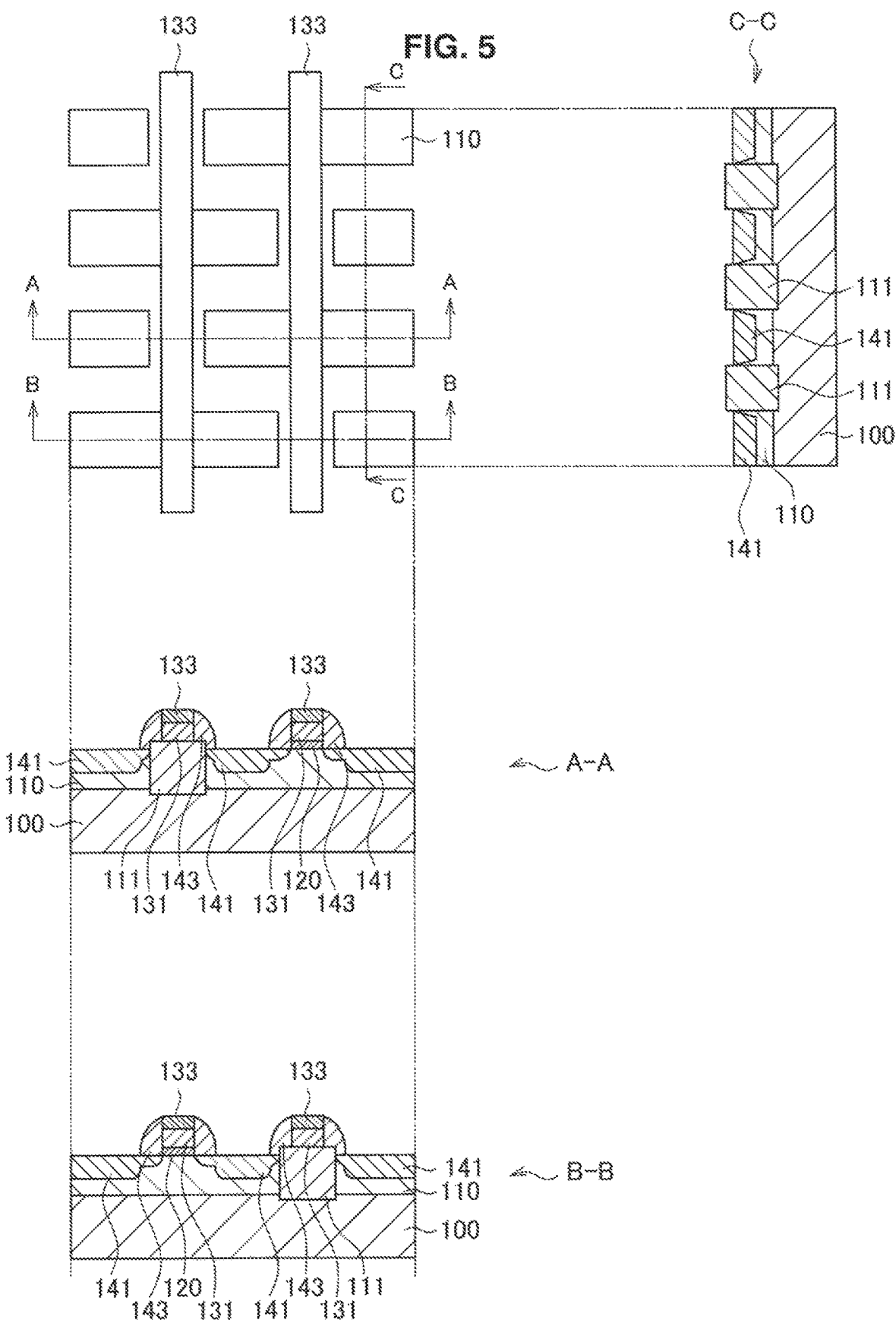
FIG. 5 is a plane view and a cross-sectional view describing each process of manufacturing of the semiconductor storage element according to the embodiment.

Next, as illustrated in FIG. 5, after the side wall insulating films 143 are formed on both side surfaces of the gate electrodes 131 and the contact layers 133, the source/drain regions 141 are formed.

Specifically, at first, on both sides of the gate electrodes 131, the LDD region is formed by ion-implanting arsenic (AS) that is an impurity of the second conductivity type at concentration of 5 to $20\times10^{14}/cm^2$ at 5 keV to 10 keV. Because a short channel effect can be suppressed by forming the LDD region, variations in properties of the selection transistors Ts can be suppressed.

Next, after $SiO_2$ is formed into a film having a film thickness of 10 nm to 30 nm, by the plasma CVD method, $Si_3N_4$ is formed into a film having a film thickness of 30 nm to 50 nm, by the plasma CVD method, and an insulating film for side walls is formed. After that, by performing anisotropic etching with respect to the insulating film for side walls, the side wall insulating films 143 are formed on both side surfaces of the gate electrode 131.

After that, by ion-implanting arsenic (AS) that is an impurity of the second conductivity type at concentration of 1 to $2\times10^{15}/cm^2$ at 40 keV to 50 keV, the impurity is introduced to the activation regions 110 of the both sides of the gate electrodes 131. Furthermore, by performing Rapid Thermal Annealing (RTA) for five seconds at 1000° C., the ion-implanted impurity is activated. The source/drain regions 141 of the selection transistors Ts are thereby formed. Note that, for suppressing diffusion of the impurity to an unintended region, activation of the impurity can also be performed by spike RTA.

Note that, by the above processes, a field effect transistor constituting a logic circuit such as a complementary metal-oxide-semiconductor (CMOS) can also be formed in a region different from the region in which the semiconductor storage element 1 is to be formed. An LSI (so-called SoC) on which a semiconductor storage device including the semiconductor storage elements 1 arrayed in a matrix, and an arithmetic device including a CMOS and the like are mixedly mounted can be thereby manufactured through a smaller number of processes.

Figure 6:
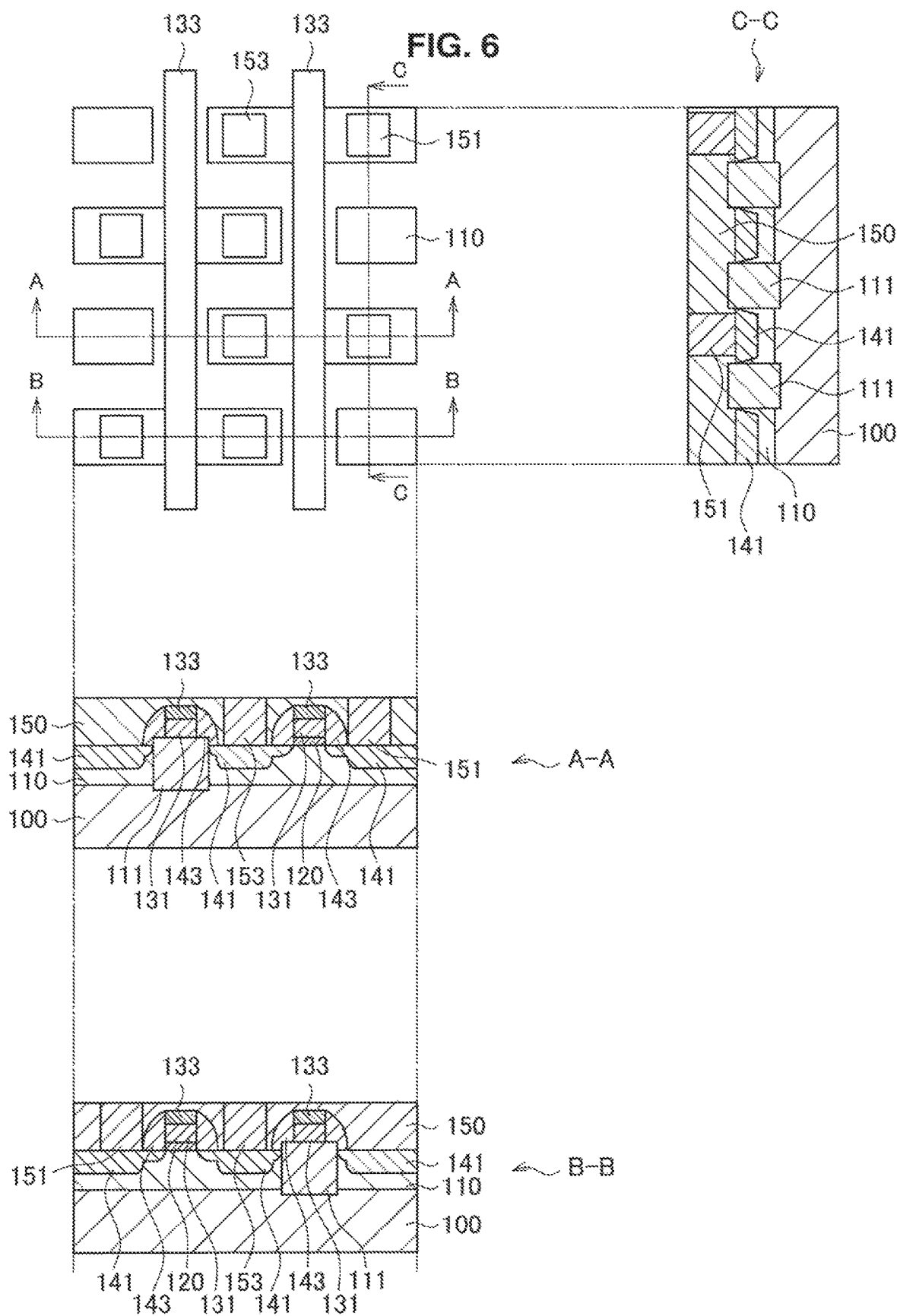
FIG. 6 is a plane view and a cross-sectional view describing each process of manufacturing of the semiconductor storage element according to the embodiment.

Next, as illustrated in FIG. 6, the planarization film 150 is formed over the entire surface of the semiconductor substrate 100, and then the first contact plugs 151 and 153 are formed.

Specifically, by performing planarization by the CMP method after $SiO_2$ is formed into a film having a film thickness of 100 nm to 500 nm, using the CVD method or the like, the planarization film 150 is formed. Next, by etching the planarization film 150, an opening is formed. Subsequently, by forming Ti and TiN into films by the CVD method or the like, in the formed opening, and further forming W into films, and then, performing planarization by the CMP method, the first contact plugs 151 and 153 are formed. Note that, Ti and TiN may be formed into films by the sputtering method or the like that uses the Ion Metal Plasma (IMP). In addition, planarization may be performed using whole surface etch back in place of the CMP method.

Here, before the planarization film 150 is formed, a liner layer including SiN may be formed. Specifically, the liner layer may be formed by forming SiN into a film having a film thickness of 10 nm to 50 nm, by the plasma CVD method. Note that the liner layer can also be formed by the low-pressure CVD method or the ALD method. In a case where the liner layer is provided, by performing etching under a condition where the liner layer and the planarization film 150 have a high selection ratio, the planarization film 150 can be etched with good controllability. Furthermore, the liner layer can also be formed as a layer that adds compressional stress or tensile stress.

Figure 7:
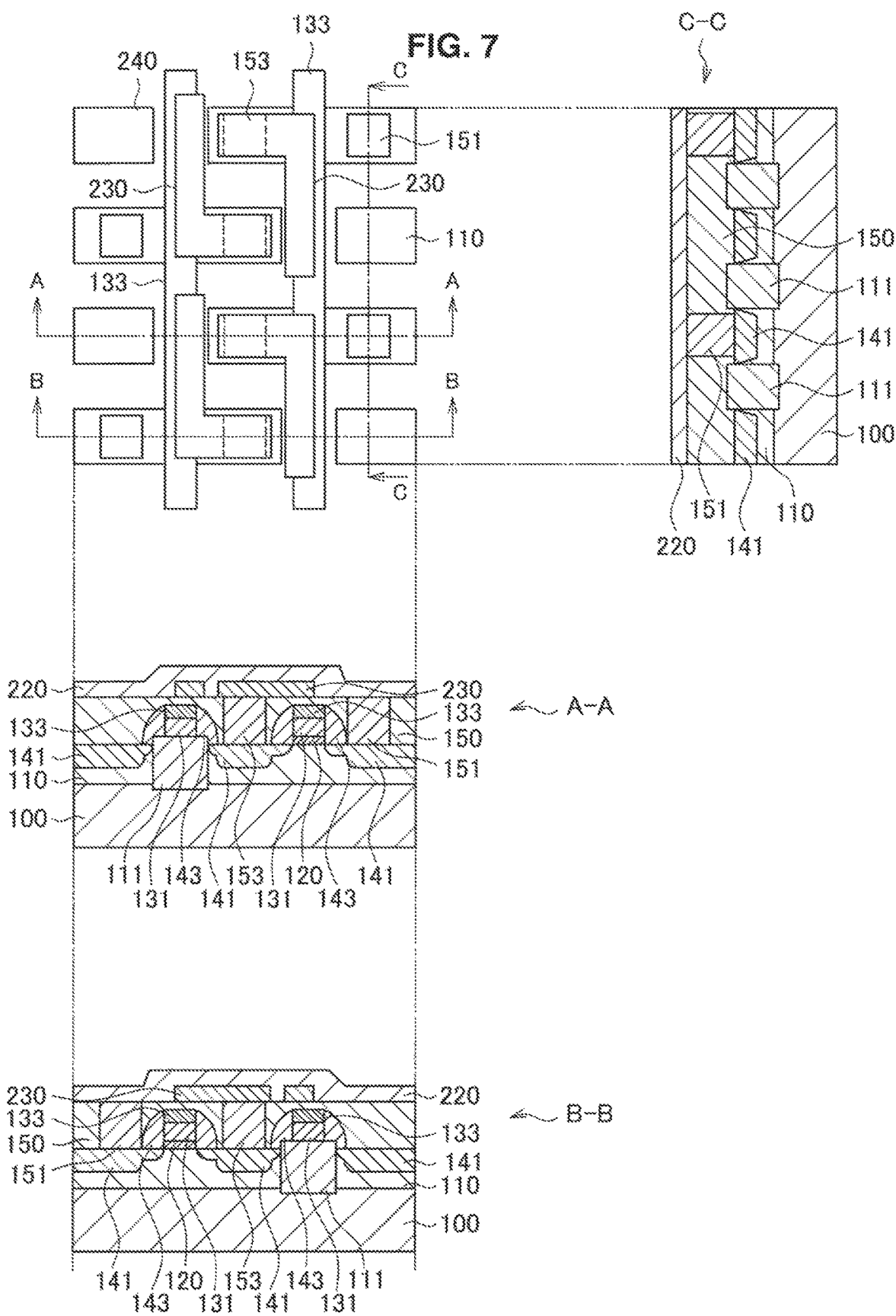
FIG. 7 is a plane view and a cross-sectional view describing each process of manufacturing of the semiconductor storage element according to the embodiment.

Subsequently, as illustrated in FIG. 7, the connection layer 230 and the gate insulator film 220 are formed on the planarization film 150.

Specifically, by forming TiN into a film having a film thickness of 20 nm to 100 nm, on the planarization film 150 using the PVD method, the CVD method, the ALD method, or the like, and then, performing anisotropic etching using, as a mask, a resist patterned by lithography, the connection layer 230 is formed. Next, by forming hafnium oxide ($HfO_x$) being a high dielectric member, into a film having a film thickness of 3 nm to 10 nm, using the CVD method, the ALD method, or the like, the gate insulator film 220 is formed.

Subsequently, by performing annealing at a temperature of 400° C. to 1000° C., the gate insulator film 220 is crystallized and formed as a ferroelectric. As a time of annealing, an appropriate time from one second or less to one hour or more can be selected depending on the materials of the gate insulator film 220 and the connection layer 230. In addition, for promoting crystallization and orientation of the gate insulator film 220, the connection layer 230 may be provided with a film serving as a base. This can enhance a crystal property and orientation of the gate insulator film 220 using a crystal property of the connection layer 230.

Note that, as the gate insulator film 220, in place of hafnium oxide, perovskite ferroelectric material such as lead zirconium titanate (PZT) or strontium bismuth tantalite (SBT) can also be used, or zirconium oxide ($ZrO_x$), hafnium zirconium oxide ($HfZrO_x$), or the like can also be used. In addition, as the gate insulator film 220, a film obtained by converting high-dielectric material into a ferroelectric film by doping the high-dielectric material with lanthanum (La), silicon (Si), gadolinium (Gd), or the like may be used.

Figure 8:
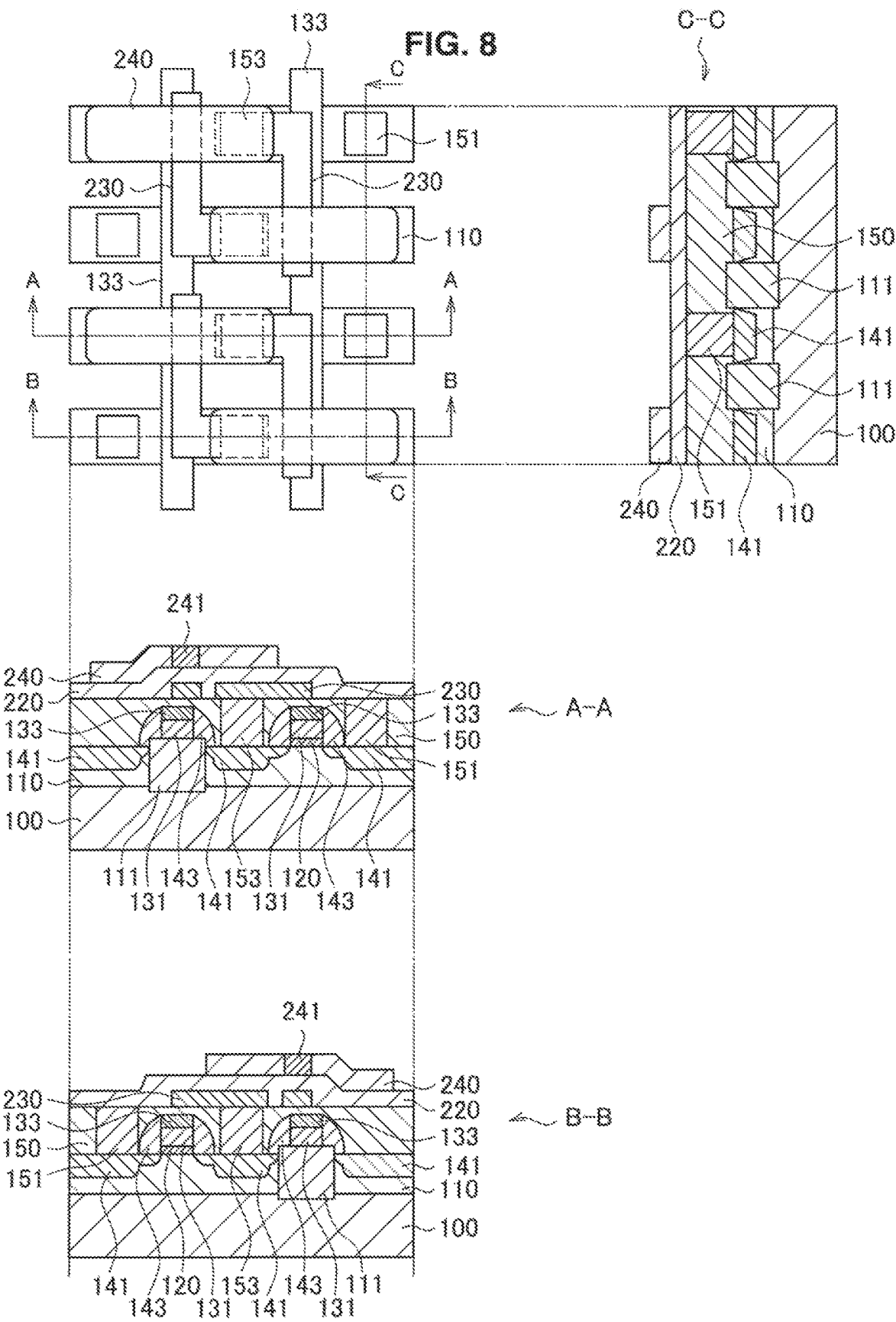
FIG. 8 is a plane view and a cross-sectional view describing each process of manufacturing of the semiconductor storage element according to the embodiment.

Next, as illustrated in FIG. 8, the semiconductor layer 240 is formed on the gate insulator film 220, and the channel region 241 and the source/drain regions are formed in the semiconductor layer 240.

Specifically, first of all, by forming polysilicon into a film having a film thickness of 10 nm to 20 nm, using the low-pressure CVD method, and then, performing anisotropic etching using, as a mask, a resist patterned by lithography, the semiconductor layer 240 is formed. Next, by ion-implanting arsenic (As) being an impurity of the second conductivity type at concentration of 0.5 to $2\times10^{15}/cm^2$ at 10 keV to 20 keV, to the semiconductor layer 240 in a predetermined region, and performing activation annealing of 1 second to 10 seconds at 900° C. to 1000° C., for example, the source/drain regions are formed on both sides of the channel region 241.

Note that, for the semiconductor layer 240, a semiconductor other than polysilicon may be used, and for example, a compound semiconductor such as Ge, GaAs, or InGaAs, an oxide semiconductor such as ZnO or InGaZnO, or a two-dimensional semiconductor such as $MoS_2$ can also be used.

Figure 9:
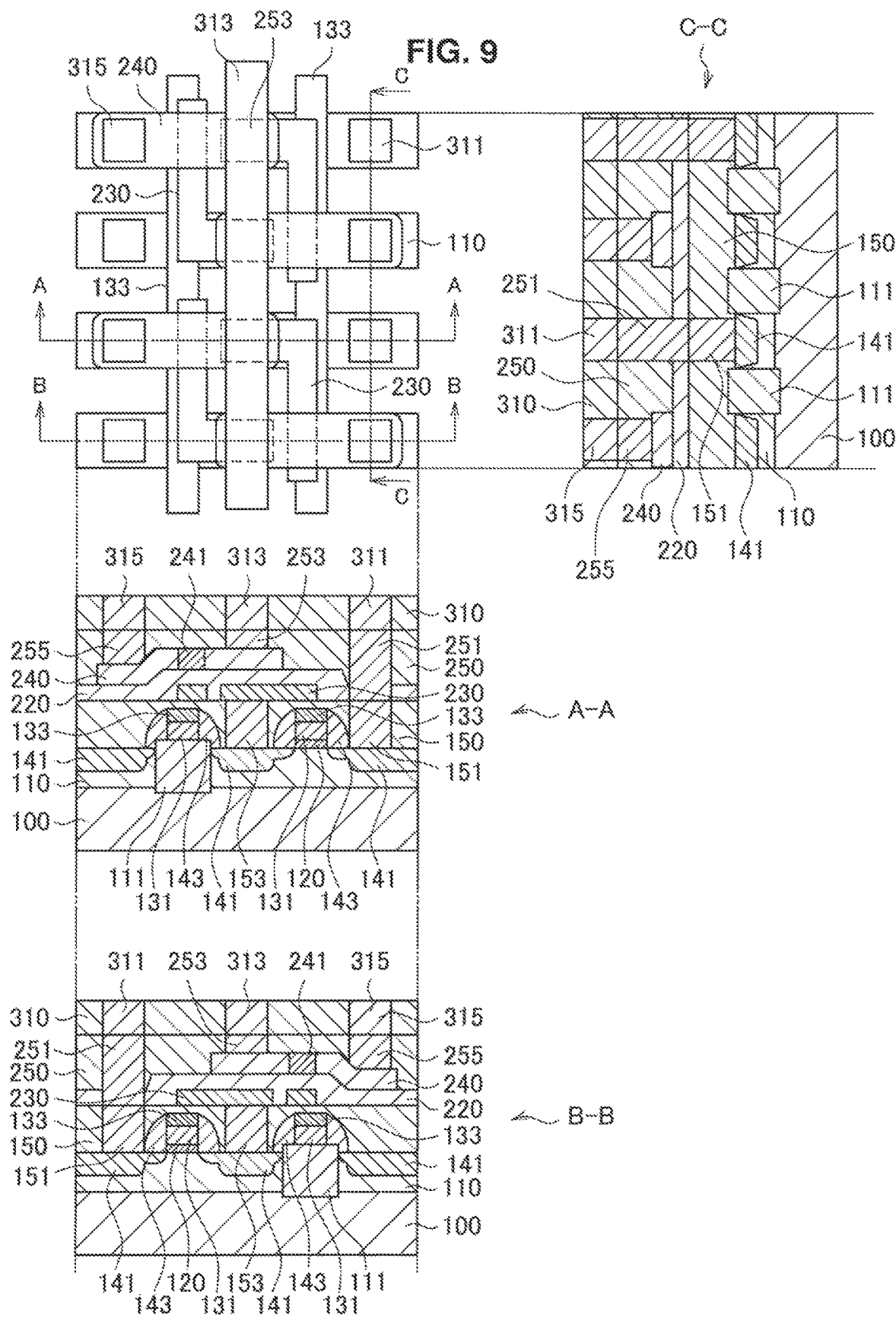
FIG. 9 is a plane view and a cross-sectional view describing each process of manufacturing of the semiconductor storage element according to the embodiment.

Subsequently, as illustrated in FIG. 9, after the first interlayer insulating film 250 is formed over the entire surface of the semiconductor substrate 100, the second contact plugs 251, 253, and 255 are formed. Furthermore, after the second interlayer insulating film 310 is formed over the entire surface of the semiconductor substrate 100, the first wiring layers 311, 313, and 315 are formed.

Specifically, by performing planarization by the CMP method after forming $SiO_2$ into a film having a film thickness of 50 nm to 200 nm, using the CVD method or the like, so as to bury the semiconductor layer 240, the first interlayer insulating film 250 is formed. Subsequently, by etching the first interlayer insulating film 250, an opening is formed. Next, in the opening formed, by forming Ti and TiN into films by the CVD method or the like, and forming W into films, and then further performing planarization by the CMP method, the second contact plugs 251, 253, and 255 are formed. Note that, Ti and TiN may be formed into films by the sputtering method or the like that uses IMP. In addition, planarization may be performed using whole surface etch back in place of the CMP method.

Next, by performing planarization by the CMP method after forming $SiO_2$ into a film having a film thickness of 50 nm to 200 nm, on the first interlayer insulating film 250 using the CVD method or the like, the second interlayer insulating film 310 is formed. Next, by using a damascene structure or a dual damascene structure after an opening for contact with the second contact plugs 251, 253, and 255 is formed, the first wiring layers 311, 313, and 315 include wiring material such as Cu. Note that the first wiring layers 311, 313, and 315 may include Al or the like.

By being extended in a direction perpendicular to the extending direction of the activation regions 110, on the second contact plug 253 of each of the semiconductor storage elements 1, the first wiring layer 313 functions as a wire that connects the source/drain of the memory cell transistor Tm and the power source Vs. In addition, the first wiring layers 311 and 315 that are formed on the second contact plugs 251 and 255 function as a base of the second wiring layer 321 to be formed in a subsequent stage.

Next, as illustrated in FIG. 10, after the third interlayer insulating film 320 is formed over the entire surface of the semiconductor substrate 100, the second wiring layer 321 is formed.

Specifically, by performing planarization by the CMP method after forming $SiO_2$ into a film having a film thickness of 50 nm to 200 nm, on the second interlayer insulating film 310 using the CVD method or the like, the third interlayer insulating film 320 is formed. Next, by using a damascene structure or a dual damascene structure after an opening for contact with the first wiring layers 311, 313, and 315 is formed, the second wiring layer 321 includes wiring material such as Cu. Note that the second wiring layer 321 may include aluminum (Al) or the like.

By being extended in a direction parallel to the extending direction of the activation regions 110, on the second contact plug 251 of each of the semiconductor storage elements 1, the second wiring layer 321 functions as the first bit line BL1 that connects the source/drains of the selection transistors Ts. In addition, by being extended in a direction parallel to the extending direction of the activation regions 110, on the second contact plug 255 of each of the semiconductor storage elements 1, the second wiring layer 321 functions as the second bit line BL2 that connects the source/drains of the memory cell transistors Tm.

Note that the first interlayer insulating film 250, the second interlayer insulating film 310, and the third interlayer insulating film 320 that have been described above may each include low-dielectric constant material.

According to the above processes, the semiconductor storage element 1 according to the present embodiment can be formed.

5. CONCLUSION

As described above, by providing the memory cell transistor Tm storing information and the selection transistor Ts functioning as a switching element, with being stacked in the thickness direction, the semiconductor storage element 1 according to an embodiment of the present disclosure can reduce a planar area more. In addition, the semiconductor storage element 1 according to the present embodiment can reduce a planar area more by forming the memory cell transistor Tm as a thin film transistor. With this configuration, the semiconductor storage element 1 according to the present embodiment can enhance an integration degree while decreasing manufacturing cost.

In addition, according to the present disclosure, a semiconductor storage device in which a plurality of semiconductor storage elements 1 is arranged in a matrix can also be provided. Because such a semiconductor storage device can enhance storage density more, further larger capacity can be achieved.

In addition, according to the present disclosure, a semiconductor system in which the semiconductor storage element 1 or a semiconductor storage device and an arithmetic device are mounted on one semiconductor chip can also be provided. In such a semiconductor system, because memory capacity increases, a higher-speed operation is enabled.

Furthermore, the semiconductor storage element 1, the semiconductor storage device, or the semiconductor system according to an embodiment of the present disclosure can be mounted on electronic device such as a personal computer, various display devices such as a liquid crystal display device and an organic electroluminescence display device, a mobile phone, a smartphone, a game device, and an Internet of Things (IoT) device, for example. It should be appreciated that these electronic devices are also included in the technical scope of the present disclosure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A semiconductor storage element including:

a memory cell transistor including a gate insulator film at least partially including ferroelectric material; and a selection transistor provided in such a manner that one of a source or a drain is connected with a gate electrode of the memory cell transistor via a connection layer, and a gate insulator film faces the gate insulator film of the memory cell transistor in a layer stack direction across the connection layer.

(2)
The semiconductor storage element according to (1), in which the memory cell transistor is a thin film transistor in which a gate electrode, and a source and a drain are provided on opposite sides across a gate insulator film.

(3)
The semiconductor storage element according to (2), in which the memory cell transistor is a bottom gate transistor in which a gate electrode is provided below a gate insulator film.

(4)
The semiconductor storage element according to any one of (1) to (3), in which the selection transistor is a field effect transistor in which a gate insulator film is provided on a semiconductor substrate and a gate electrode is provided on the gate insulator film.

(5)
The semiconductor storage element according to any one of (1) to (4), in which a planar shape of the connection layer is a hook-like shape in which a straight line is bent at at least one or more bending points.

(6)
The semiconductor storage element according to any one of (1) to (5), in which the memory cell transistor and the selection transistor are provided in different planar regions when planarly viewed from the layer stack direction.

(7)
The semiconductor storage element according to any one of (1) to (6), in which the connection layer is provided integrally with the gate electrode of the memory cell transistor.

(8)
The semiconductor storage element according to (7), in which the connection layer includes metal, an alloy, or a metal compound, and
the gate insulator film of the memory cell transistor is provided on the connection layer.

(9)
The semiconductor storage element according to any one of (1) to (8), in which the selection transistor connects with a word line at a gate, and connects with a first bit line at another one of the source or the drain, and
the memory cell transistor connects with a second bit line at one of a source or a drain, and connects with a power source or a ground at another one of the source or the drain.

(10)
The semiconductor storage element according to claim 9, in which the other one of the source or the drain of the selection transistor, and the first bit line are connected by a contact plug provided on the drain to penetrate through in the layer stack direction.

(11)
The semiconductor storage element according to (9) or (10), in which extending directions of the first bit line and the second bit line are parallel to each other, and
an extending direction of the word line, and the extending directions of the first bit line and the second bit line are orthogonal to each other.

(12)
A semiconductor storage device including:
a plurality of semiconductor storage elements arranged in a matrix, the plurality of semiconductor storage elements each including
a memory cell transistor including a gate insulator film at least partially including ferroelectric material, and
a selection transistor provided in such a manner that one of a source or a drain is connected with a gate electrode of the memory cell transistor via a connection layer, and a gate insulator film faces the gate insulator film of the memory cell transistor in a layer stack direction across the connection layer.

(13)
A semiconductor system including:
a storage device including a plurality of semiconductor storage elements arranged in a matrix and each including a memory cell transistor including a gate insulator film at least partially including ferroelectric material, and a selection transistor provided in such a manner that one of a source or a drain is connected with a gate electrode of the memory cell transistor via a connection layer, and a gate insulator film faces the gate insulator film of the memory cell transistor in a layer stack direction across the connection layer; and
an arithmetic device connected with the storage device,
in which the storage device and the arithmetic device are mounted on one semiconductor chip.

REFERENCE SIGNS LIST

1 semiconductor storage element
100 semiconductor substrate
110 activation region
111 element separation region
120 gate insulator film
131 gate electrode
141 source/drain region
150 planarization film
151, 153 first contact plug
220 gate insulator film
230 connection layer
240 semiconductor layer
250 first interlayer insulating film
251, 253, 255 second contact plug
310 second interlayer insulating film
311, 313, 315 first wiring layer
320 third interlayer insulating film
321 second wiring layer
Tm memory cell transistor
Ts selection transistor

The invention claimed is:
1. A semiconductor storage element, comprising:
a memory cell transistor including a semiconductor layer, a first gate electrode, a connection layer, and a first gate insulator film, wherein
the semiconductor layer comprises a channel region, a first source of the memory cell transistor, and a first drain of the memory cell transistor,
the semiconductor layer is on the first gate insulator film,
a portion of the semiconductor layer overlaps the connection layer in a planar view from a layer stack direction,
the first gate insulator film is on the connection layer, and
the first gate insulator film includes a ferroelectric material; and a selection transistor including a second source, a second drain, and a second gate insulator film,
wherein
one of the second source or the second drain is connected with the first gate electrode of the memory cell transistor via the connection layer, and
the second gate insulator film faces the first gate insulator film of the memory cell transistor in the layer stack direction across the connection layer.

2. The semiconductor storage element according to claim 1, wherein the memory cell transistor is a thin film transistor in which the first gate electrode, and the first source and the first drain are on opposite sides across the first gate insulator film.

3. The semiconductor storage element according to claim 2, wherein the memory cell transistor is a bottom gate transistor in which the first gate electrode is below the first gate insulator film.

4. The semiconductor storage element according to claim 1, wherein
the selection transistor further includes a second gate electrode, and
the selection transistor is a field effect transistor in which the second gate insulator film is on a semiconductor substrate and the second gate electrode is on the second gate insulator film.

5. The semiconductor storage element according to claim 1, wherein a planar shape of the connection layer is a hook-like shape in which a straight line is bent at at least one bending point.

6. The semiconductor storage element according to claim 1, wherein the memory cell transistor and the selection transistor are in different planar regions in the planar view from the layer stack direction.

7. The semiconductor storage element according to claim 1, wherein the connection layer is integral with the first gate electrode of the memory cell transistor.

8. The semiconductor storage element according to claim 7, wherein the connection layer includes one of a metal, an alloy, or a metal compound.

9. The semiconductor storage element according to claim 1, wherein
the selection transistor further includes a second gate electrode,
the second gate electrode of the selection transistor is connected with a word line,
the other of the second source or the second drain is connected with a first bit line,
one of the first source or the first drain of the memory cell transistor is connected with a second bit line, and
the other of the first source or the first drain is connected with one of a power source or a ground.

10. The semiconductor storage element according to claim 9, wherein
the other of the second source or the second drain of the selection transistor, and the first bit line are connected by a contact plug, and
the contact plug is on the second drain to penetrate through in the layer stack direction.

11. The semiconductor storage element according to claim 9, wherein
extending directions of the first bit line and the second bit line are parallel to each other, and
an extending direction of the word line is orthogonal to the extending directions of the first bit line and the second bit line.

12. A semiconductor storage device, comprising:
a plurality of semiconductor storage elements in a matrix, wherein each of the plurality of semiconductor storage elements includes:
a memory cell transistor including a semiconductor layer, a gate electrode, a connection layer, and a first gate insulator film, wherein
the semiconductor layer comprises a channel region, a first source of the memory cell transistor, and a first drain of the memory cell transistor,
the semiconductor layer is on the first gate insulator film,
a portion of the semiconductor layer overlaps the connection layer in a planar view from a layer stack direction,
the first gate insulator film is on the connection layer, and
the first gate insulator film includes a ferroelectric material; and
a selection transistor including a second source, a second drain, and a second gate insulator film, wherein
one of the second source or the second drain of the selection transistor is connected with the gate electrode of the memory cell transistor via the connection layer, and
the second gate insulator film faces the first gate insulator film of the memory cell transistor in the layer stack direction across the connection layer.

13. A semiconductor system, comprising:
a storage device including a plurality of semiconductor storage elements in a matrix, wherein each of the plurality of semiconductor storage elements includes:
a memory cell transistor including a semiconductor layer, a gate electrode, a connection layer, and a first gate insulator film, wherein
the semiconductor layer comprises a channel region, a first source of the memory cell transistor, and a first drain of the memory cell transistor,
the semiconductor layer is on the first gate insulator film,
a portion of the semiconductor layer overlaps the connection layer in a planar view from a layer stack direction,
the first gate insulator film is on the connection layer, and
the first gate insulator film includes a ferroelectric material; and
a selection transistor including a second source, a second drain, and a second gate insulator film, wherein
one of the second source or the second drain of the selection transistor is connected with the gate electrode of the memory cell transistor via the connection layer, and
the second gate insulator film faces the first gate insulator film of the memory cell transistor in the layer stack direction across the connection layer; and
an arithmetic device connected with the storage device, wherein the storage device and the arithmetic device are on one semiconductor chip.

* * * * *